United States Patent
Nam et al.

(10) Patent No.: US 7,885,118 B2
(45) Date of Patent: Feb. 8, 2011

(54) FLASH MEMORY DEVICE AND VOLTAGE GENERATING CIRCUIT FOR THE SAME

(75) Inventors: Sang-Wan Nam, Hwaseong-si (KR); Dae-Han Kim, Namyangju-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 92 days.

(21) Appl. No.: 12/401,784

(22) Filed: Mar. 11, 2009

(65) Prior Publication Data

US 2009/0251961 A1    Oct. 8, 2009

(30) Foreign Application Priority Data

Apr. 3, 2008    (KR) ............................... 200831295

(51) Int. Cl.
*G11C 11/34*    (2006.01)
(52) U.S. Cl. ............................... 365/185.2; 365/185.24
(58) Field of Classification Search ............... 365/185.2, 365/185.24
See application file for complete search history.

(56) References Cited

U.S. PATENT DOCUMENTS 6,297,974 B1 * 10/2001 Ganesan et al. ............... 363/60
6,400,213 B2 * 6/2002 Shih et al. ................... 327/540
6,442,079 B2 * 8/2002 Lee et al. ............... 365/189.09
7,486,557 B2 * 2/2009 Kim et al. .............. 365/185.11
2007/0069819 A1    3/2007 Hayashi et al.

FOREIGN PATENT DOCUMENTS

| JP | 2007086980 | 4/2007 |
| JP | 2007280025 | 10/2007 |
| KR | 1020050088778 | 9/2005 |

* cited by examiner

*Primary Examiner*—Michael T Tran
(74) *Attorney, Agent, or Firm*—Volentine & Whitt, P.L.L.C.

(57) ABSTRACT

Disclosed is a flash memory device which includes a memory core, a high voltage generating circuit and a reference voltage generating circuit. The high voltage generating circuit is configured to generate a high voltage to be supplied to the memory core. The reference voltage generating circuit is configured to generate at least one reference voltage to be supplied to the high voltage generating circuit. The reference voltage generating circuit includes a first reference voltage generator configured to generate a first reference voltage in response to a supply voltage, and a second reference voltage generator configured to generate a second reference voltage in response to the first reference voltage. The at least one reference voltage supplied to the high voltage generating circuit includes the second reference voltage.

18 Claims, 7 Drawing Sheets

US 7,885,118 B2

FLASH MEMORY DEVICE AND VOLTAGE GENERATING CIRCUIT FOR THE SAME

PRIORITY CLAIM

A claim of priority under 35 U.S.C. §119 is made to Korean Patent Application No. 10-2008-0031295 filed on Apr. 3, 2008, the entire contents of which are hereby incorporated by reference.

SUMMARY

Embodiments of the present invention relate to a semiconductor memory device, and more particularly, to a flash memory device and a voltage generating circuit for supplying voltages to program, erase and read data of a flash memory device.

Semiconductor memories are important microelectronic components of digital logic system designs, such as computers and microprocessor-based systems, and applications ranging from satellites to consumer electronics. Therefore, advances in the fabrication of semiconductor memories, including process enhancements and scaling for higher densities and faster speeds, help establish performance standards for other digital logic families.

Semiconductor memory devices are generally classified as volatile semiconductor memory devices or non-volatile memory devices. With respect to volatile semiconductor memory devices, data may be stored and read while power is applied, but data is lost when power is removed. In contrast, non-volatile memory devices, such as mask read only memory (ROM) (MROM), programmable ROM (PROM), electrically programmable ROM (EPROM), electrically erasable and programmable ROM (EEPROM), and the like, are able to store data even when power is removed.

With respect to non-volatile memories, MROM, PROM and EPROM cannot be erased and programmed by the systems in which they are incorporated, so it is not easy for general users to update stored contents. EEPROM, however, may be electrically erased and programmed. EEPROM applications have broadened to include auxiliary memory or system programming, which may be updated. In particular, a flash EEPROM (hereinafter, referred to as a flash memory) exhibits a higher degree of integration than a conventional EEPROM, and thus is useful in large auxiliary memory applications.

Flash memories are classified as NOR flash memories and NAND flash memories, based on the structure in which memory cells and bit lines are connected. NOR flash memories have structures that include two or more cell transistors connected in parallel to one bit line. NOR flash memories may store data using channel hot electron injection and erase data using Fowler-Nordheim (FN) tunneling. NAND flash memories have structures that include two or more cell transistors connected in series to one bit line. NAND flash memories may store and erase data using FN tunneling. In general, NOR flash memories are not conducive to high integration because of the current consumption needed to support high speeds. Recently, NOR flash memories have been adapted to store multi-bit (or multi-level) data per cell in order to increase the degree of integration.

For example, in a flash memory that stores single-bit data per cell, data stored in each cell may be expressed by two threshold voltage distributions corresponding to data "1" and data "0." However, in a flash memory that stores multi-bit (e.g., two-bit) data per cell, data stored in each cell may be expressed by four threshold voltage distributions corresponding to data "11," data "10," data "00" and data "01," respectively. As the number of data bits that can be stored in each cell increases, various voltages are required for programming, erasing and reading data. Thus, in order to program, erase and read data more exactly, corresponding voltages must be precisely generated. Further, techniques are required to maintain these voltages at predetermined levels with little to no variation.

One aspect of the present invention provides a flash memory device which includes a memory core, a high voltage generating circuit and a reference voltage generating circuit. The high voltage generating circuit is configured to generate a high voltage to be supplied to the memory core. The reference voltage generating circuit is configured to generate at least one reference voltage to be supplied to the high voltage generating circuit. The reference voltage generating circuit includes a first reference voltage generator configured to generate a first reference voltage in response to a supply voltage, and a second reference voltage generator configured to generate a second reference voltage in response to the first reference voltage. The at least one reference voltage supplied to the high voltage generating circuit includes the second reference voltage.

Another aspect of the present invention provides a reference voltage generating circuit which includes first and second reference voltage generators. The first reference voltage generator is configured to generate a first reference voltage in response to a supply voltage. The second reference voltage generator is configured to generate a second reference voltage in response to the first reference voltage. The second reference voltage is used to generate a high voltage supplied to a memory core.

BRIEF DESCRIPTION OF THE FIGURES

The attached drawings illustrate exemplary and non-limiting embodiments of the present invention, where like reference numerals refer to like parts throughout the figures unless otherwise specified.

DETAILED DESCRIPTION OF THE EMBODIMENTS

Figure 1:
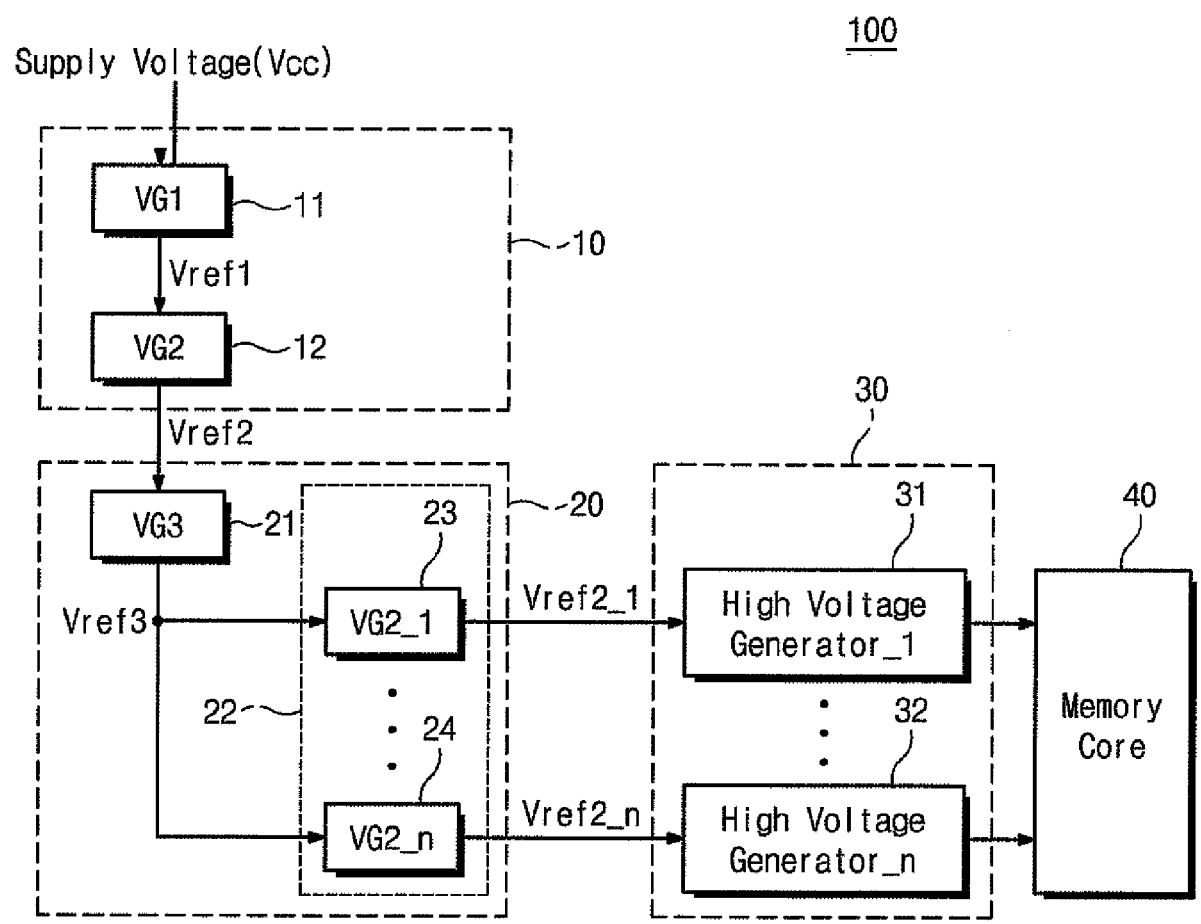
FIG. 1 is a block diagram showing a flash memory device, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Generally, a flash memory device according to various embodiments of the present invention includes a memory core having multiple memory cells, a high voltage generating circuit for generating a high voltage to be applied to the memory cells, and a reference voltage generating circuit for supplying reference voltages to the high voltage generating circuit. The reference voltage generating circuit may include a first reference voltage generator for receiving a supply voltage to generate a first reference voltage, and a second reference voltage generator for receiving the first reference voltage to generate a second reference voltage to be supplied to the high voltage generating circuit. In accordance with the various embodiments, a variation range of the high voltage generated by the high voltage generating circuit is reduced, enabling program, erase and read operations of the flash memory device to be stably performed.

FIG. 1 is a block diagram showing a flash memory device, according to an illustrative embodiment of the present invention.

Referring to the embodiment depicted in FIG. 1, a flash memory device 100 includes first and second reference voltage generators 10 and 20 of a reference voltage generating circuit, a high voltage generating circuit 30, and a memory core 40.

The memory core 40 may be a NOR flash memory, for example. A NOR flash memory requires a high voltage of −10V to +10V for a write operation, for example, and a high voltage having a negligible variation range to sense current of a programmed cell in a verification/read operation.

The first reference voltage generator 10 includes a first voltage generator 11 and a second voltage generator 12. The second reference voltage generator 20 includes a third voltage generator 21 and voltage generating part 22 having multiple voltage generators, indicated by representative 2_1 voltage generator 23 through representative 2_n voltage generator 24, which respectively supply reference voltages Vref2_1 to Vref2_n to the high voltage generating circuit 30. The first and second reference voltage generators 10 and 20 generate reference voltages having smaller variation ranges, so that the high voltage generating circuit 30 is able to generate high voltages having smaller variation ranges.

A structure of the first voltage generator 11 will be more fully described with reference to FIG. 2, and a structure of the second voltage generator 12 will be more fully described with reference to FIG. 3. A structure of the third voltage generator 21 will be more fully described with reference to FIG. 4. In an illustrative embodiment, the representative 2_1 and 2_n voltage generators 23 and 24 have the same configuration as the second voltage generator 12.

The first voltage generator 11 receives supply voltage Vcc to generate a first reference voltage Vref1. The second voltage generator 12 receives the first reference voltage Vref1 from the first voltage generator 11 to generate a second reference voltage Vref2. The third voltage generator 21 receives the second reference voltage Vref2 from the second voltage generator 12 to generate a third reference voltage Vref3, which has less variation than the first reference voltage Vref1.

The 2_1 voltage generator 23 receives the third reference voltage Vref3 from the third voltage generator 21 to generate a 2_1 reference voltage Vref2_1, which has less variation than the second reference voltage Vref2. Likewise, the 2_n voltage generator 24 receives the third reference voltage Vref3 from the third voltage generator 21 to generate a 2_n reference voltage Vref2_n, which also has less variation than the second reference voltage Vref2.

The high voltage generating circuit 30 is configured to generate multiple high voltages, which are supplied to the memory core 40. For example, high voltage generating circuit 30 may include high voltage generator 31 for generating a program voltage, and high voltage generator 32 for generating a read voltage. The high voltage generators 31 and 32 will be more fully described with reference to FIG. 5 below.

The flash memory device 100, according to an embodiment of the present invention, generates stable reference voltages having smaller variation ranges via the first and second reference voltage generators 10 and 20. Thus, the flash memory device 100 may stably supply high voltages based on the reference voltages required to program, erase and read data, respectively.

Figure 2:
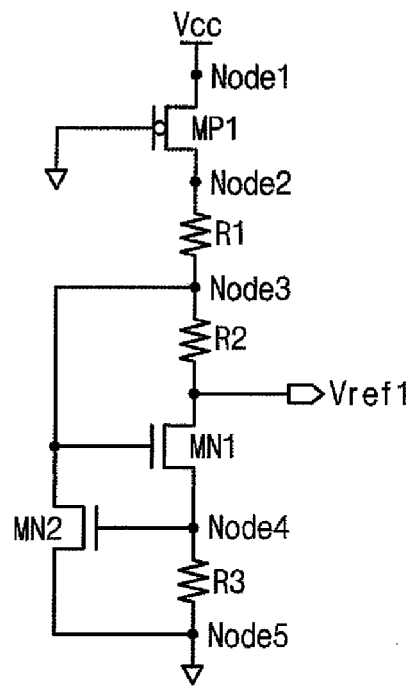
FIG. 2 is a circuit diagram showing a first voltage generator illustrated in FIG. 1, according to an embodiment of the present invention.

FIG. 2 is a circuit diagram showing a first voltage generator illustrated in FIG. 1, according to an illustrative embodiment of the present invention.

Referring to FIG. 2, the first voltage generator 11 includes a first PMOS transistor MP1 connected between a first node Node1 and a second node Node2, a first resistor R1 connected between the second node Node2 and a third node Node3, a second resistor R2 connected between the third node Node3 and an output terminal, a first NMOS transistor MN1 connected between the output terminal and a fourth node Node4, a second NMOS transistor MN2 connected between the third node Node3 and a fifth node Node5, and a third resistor R3 connected between the fourth node Node4 and the fifth node Node5. A gate of the first PMOS transistor MP1 is connected to ground, a gate of the first NMOS transistor MN1 is connected to the third node Node3 and a gate of the second NMOS transistor MN2 is connected to the fourth node Node4. A supply voltage Vcc is applied to the first node Node1, and the fifth node Node5 is grounded.

The first voltage generator 11, according to the depicted embodiment, outputs the first reference voltage Vref1 via the output terminal. That is, according to the structure of the first voltage generator 11, the supply voltage Vcc applied to the first node Node1 is transferred to the output terminal via the first PMOS transistor MP1 and the first and second resistors R1 and R2.

When the first reference voltage Vref1 at the output terminal is higher than a predetermined voltage, a voltage of the third node Node3 is increased, causing the first NMOS transistor MN1 to be activated. When the first NMOS transistor MN1 is activated, an output of the first NMOS transistor MN1 at the fourth node Node4 activates the second NMOS transistor MN2. The third node Node3 is connected to ground voltage via the activated second NMOS transistor MN2, so that the first reference voltage Vref1 drops to the predetermined voltage. In various embodiments, the predetermined voltage may be set in accordance with designs and specifications.

Figure 3:
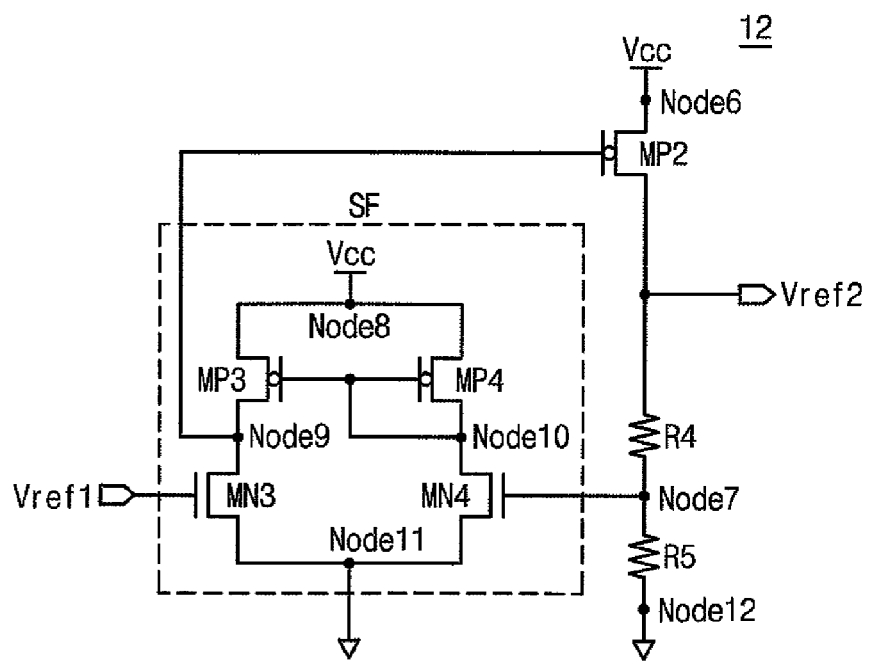
FIG. 3 is a circuit diagram showing a second voltage generator illustrated in FIG. 1, according to an embodiment of the present invention.

FIG. 3 is a circuit diagram showing a second voltage generator illustrated in FIG. 1, according to an illustrative embodiment of the present invention.

Referring to FIG. 3, the second voltage generator 12 includes a second PMOS transistor MP2 connected between a sixth node Node6 and an output terminal, a fourth resistor R4 connected between the output terminal and a seventh node Node7, a third PMOS transistor MP3 connected between an eighth node Node8 and a ninth node Node9, a fourth PMOS transistor MP4 connected between the eighth node Node8 and a tenth node Node10, a third NMOS transistor MN3 connected between the ninth node Node9 and an eleventh node Node11, a fourth NMOS transistor MN4 connected between the tenth node Node10 and the eleventh node Node11, and a fifth resistor R5 connected between the seventh node Node7 and a twelfth node Node12. A gate of the second PMOS transistor MP2 is connected to the ninth node Node9, gates of the third and fourth PMOS transistors MP3 and MP4 are connected to the tenth node Node10, a gate of the third NMOS transistor MN3 is connected to the input terminal, and a gate of the fourth NMOS transistor MN4 is connected to the seventh node Node7.

The supply voltage Vcc is applied to the sixth node Node6 and the eighth node Node8. The eleventh Node11 and the twelfth node Node12 are grounded. The third and fourth PMOS transistors MP3 and MP4 and the third and fourth NMOS transistors MN3 and MN4 constitute a source follower (SF).

The first reference voltage Vref1 is applied to the input terminal of the second voltage generator 12, and the supply voltage Vcc applied to the sixth node Node6 is transferred to the output terminal via the second PMOS transistor MP2, according to the depicted embodiment. The second PMOS transistor MP2 is controlled by a voltage difference between the first reference voltage Vref1 and a voltage of the seventh node Node7. When the second reference voltage Vref2 at the output terminal is higher than a predetermined voltage, the voltage of the seventh node Node7 increases. The voltage of the seventh node Node7 therefore becomes different from the first reference voltage Vref1, causing a voltage difference between the first reference voltage Vref1 and the voltage of the seventh node Node7. The second PMOS transistor MP2 is controlled by the voltage difference to reduce the second reference voltage Vref2 to the predetermined voltage.

In various embodiments, the predetermined voltage may be set in accordance with designs and/or specifications. In addition, the first reference voltage Vref1 may be 0.7V±40 mV, and the second reference voltage Vref2 may be 1V±60 mV, for example.

Figure 4:
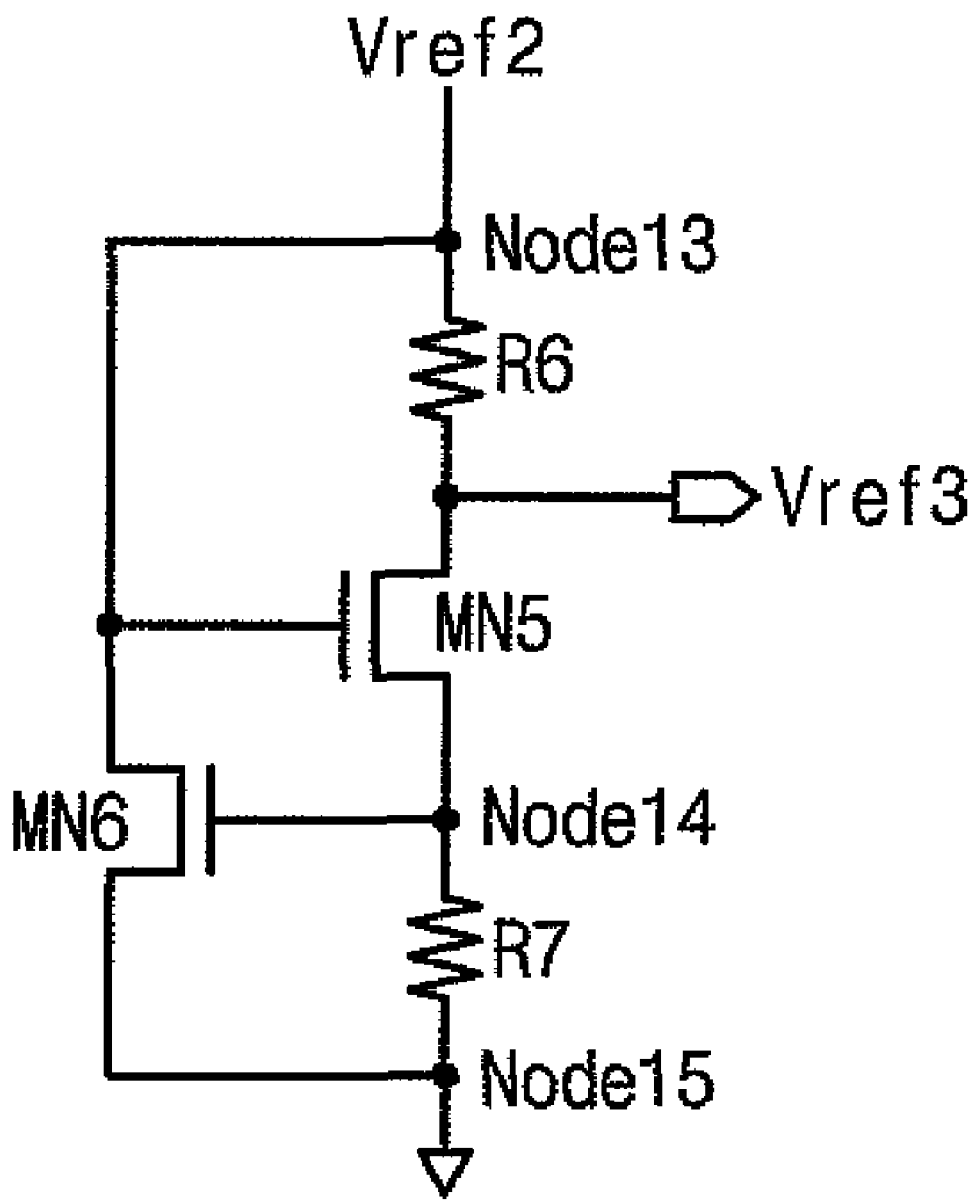
FIG. 4 is a circuit diagram showing a third voltage generator illustrated in FIG. 1, according to an embodiment of the present invention.

FIG. 4 is a circuit diagram showing a third voltage generator illustrated in FIG. 1, according to an illustrative embodiment of the present invention.

Referring to FIG. 4, the third voltage generator 21 includes a sixth resistor R6 connected between a thirteenth node Node13 and an output terminal, a fifth NMOS transistor MN5 connected between the output terminal and a fourteenth node Node14, a sixth NMOS transistor MN6 connected between the thirteenth node Node13 and a fifteenth node Node15, and a seventh resistor R7 connected between the fourteenth node Node14 and the fifteenth node Node15. A gate of the fifth NMOS transistor MN5 is connected to the thirteenth node Node1, and a gate of the sixth NMOS transistor MN6 is connected to the fourteenth node Node14. The second reference voltage Vref2 is applied to the thirteenth node Node1, and the fifteenth node Node15 is grounded.

The third voltage generator 21 outputs a third reference voltage Vref3 via the output terminal. That is, the third reference voltage Vref3 is based on the second reference voltage Vref2, applied to the first node Node1 and provided to the output terminal via the sixth resistor R6.

When the third reference voltage Vref3 is higher than a predetermined voltage, the voltage of the thirteenth node Node13 increases, which activates the fifth NMOS transistor MN5. The output of the fifth NMOS transistor MN5 at the fourteenth node Node14 activates the sixth NMOS transistor MN6. Accordingly, the thirteenth node Node13 is connected to ground voltage via the activated sixth NMOS transistor MN6, so that the third reference voltage Vref3 drops to the predetermined voltage.

In various embodiments, the predetermined voltage may be set in accordance with designs and/or specifications. In addition, the third reference voltage Vref3 may be 0.7V±6 mV, and a 2_$n$ reference voltage Vref2_$n$ may be 1V±9 mV, for example.

Figure 5:
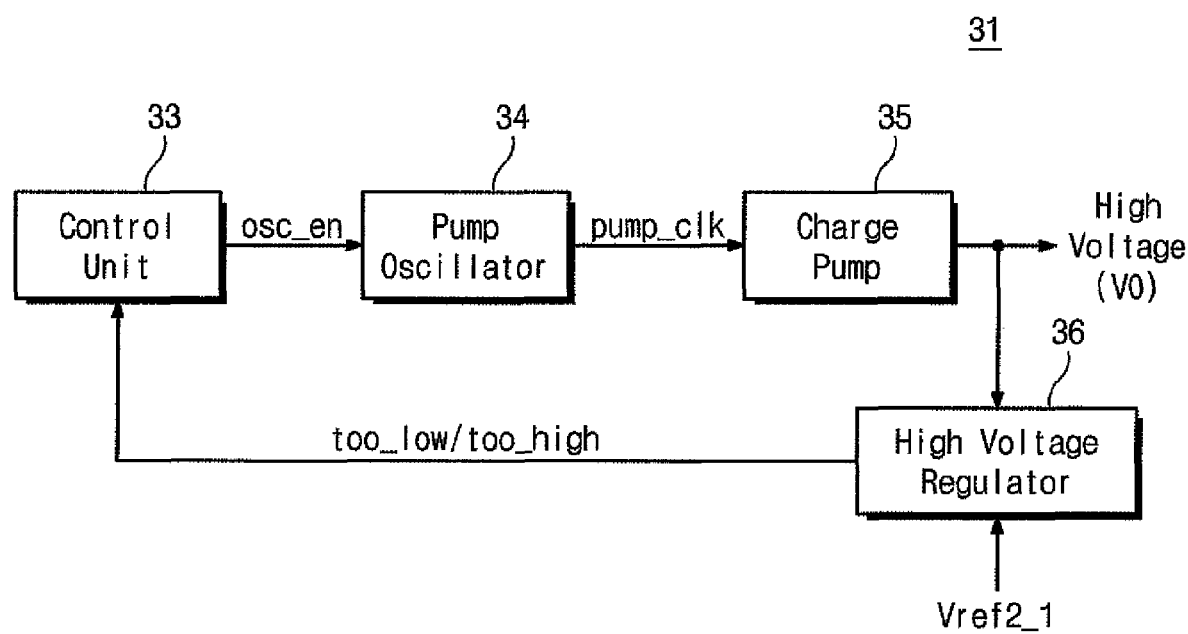
FIG. 5 is a block diagram showing a first high voltage generator illustrated in FIG. 1, according to an embodiment of the present invention.

FIG. 5 is a block diagram showing a high voltage generator illustrated in FIG. 1, according to an illustrative embodiment of the present invention. In particular, FIG. 5 depicts representative high voltage generator 31 of the high voltage generating circuit 30.

Referring to FIG. 5, the high voltage generator 31 includes a control unit 33, a pump oscillator 34, a charge pump 35, and a high voltage regulator 36. The charge pump 35 generates a high voltage V0 (e.g., higher than a power supply voltage). When the high voltage V0 is lower than a reference voltage, indicated by representative 2_1 reference voltage Vref2_1 from the 2_1 voltage generator 23, the high voltage regulator 36 outputs a first control signal too_low, indicating that the high voltage is below a given level. When the high voltage V0 is higher than the 2_1 reference voltage Vref2_1, the high voltage regulator 36 outputs a second control signal too_high, indicating that the high voltage exceeds the given level. The control unit 33 generates an oscillation enable signal osc_en in response to the first and second control signals too_low and too_high from the high voltage regulator 36. For example, when the first control signal too_low is generated by the high voltage regulator 36, the control unit 33 activates the oscillation enable signal osc_en. When the second control signal too_high is generated by the high voltage regulator 36, the control unit 33 inactivates the oscillation enable signal osc_en. The pump oscillator 34 generates a pump clock signal pump_clk in response to the activated oscillation enable signal osc_en.

The charge pump 35 performs a charge pump operation in response to the pump clock signal pump_clk to generate the high voltage V0. The high voltage V0 is again applied to the high voltage regulator 36, to control the pump operation of the charge pump 35. The high voltage V0 generated by the charge pump 35 is used for program, erase and read operations of the flash memory, according to various embodiments of the present invention.

Figure 6:
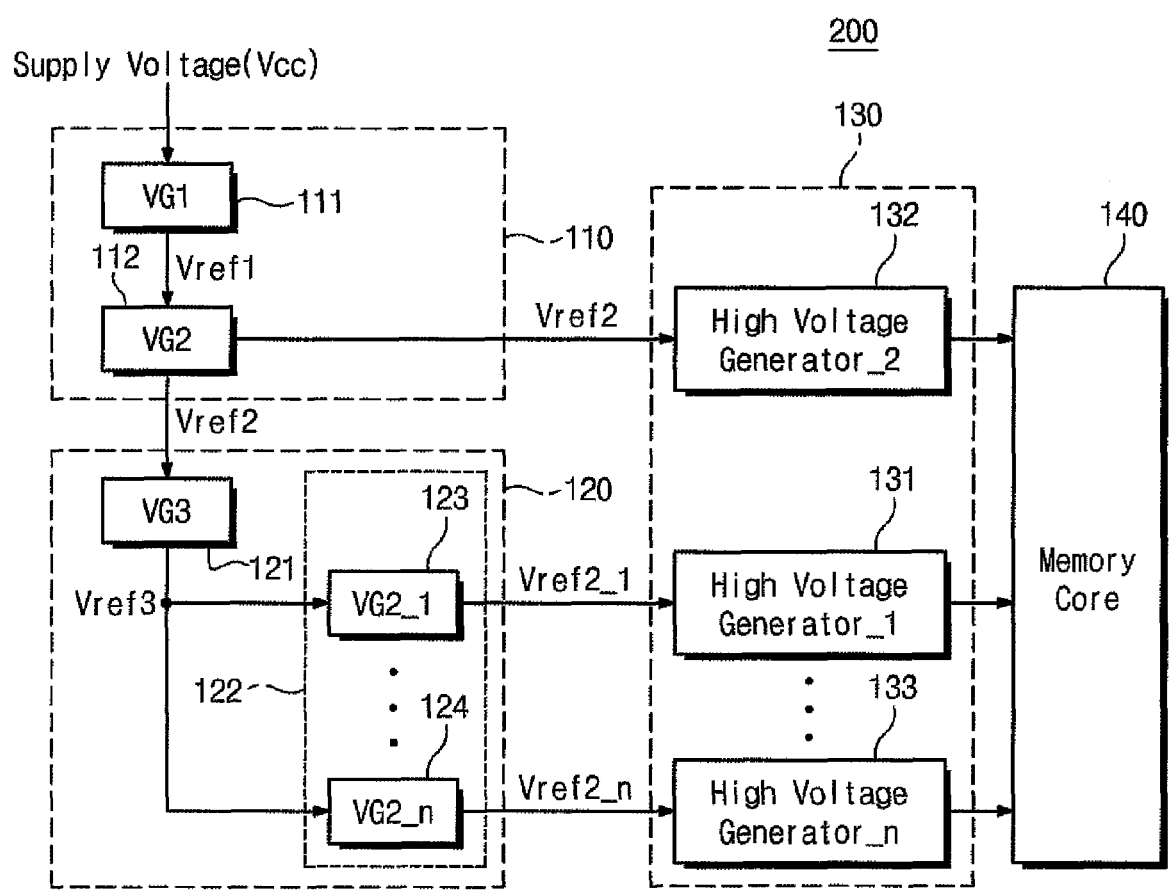
FIG. 6 is a block diagram showing a flash memory device, according to another embodiment of the present invention.

FIG. 6 is a block diagram showing a flash memory device, according to another embodiment of the present invention.

Referring to FIG. 6, a flash memory device 200 includes first and second reference voltage generators 110 and 120 of a reference voltage generating circuit a high voltage generating circuit 130, and a memory core 140.

The memory core 140 may be a NOR flash memory, for example. A NOR flash memory requires a high voltage of −10V to +10V for a write operation, for example, and a high voltage having a negligible variation range to sense current of a programmed cell in a verification/read operation.

The first reference voltage generator 110 includes a first voltage generator 111 and a second voltage generator 112. The second reference voltage generator 120 includes a third voltage generator 121, and voltage generating part 122 having multiple voltage generators, indicated by representative 2_1 voltage generator 123 to representative 2_n voltage generator 124. The 2_1 to 2_n voltage generators 123 to 124 provide reference voltages Vref2_1 to Vref2_n, respectively, to the high voltage generating circuit 130. The first and second reference voltage generators 110 and 120 generate reference voltages having smaller variation ranges, so that the high voltage generating circuit 130 is able to stably generate high voltages.

The first voltage generator 111 receives supply voltage Vcc to generate a first reference voltage Vref1. The second voltage generator 112 receives the first reference voltage Vref1 from the first voltage generator 111 to generate a second reference voltage Vref2. The third voltage generator 121 receives the second reference voltage Vref2 from the second voltage generator 112 to generate a third reference voltage Vref3, having less variation than the first reference voltage Vref1.

The 2_1 voltage generator 123 receives the third reference voltage Vref3 from the third voltage generator 121 to generate a reference voltage Vref2_1, having less variation than the second reference voltage Vref2. Likewise, the 2_n voltage generator 124 receives the third reference voltage Vref3 from the third voltage generator 121 to generate a reference voltage Vref2_n, having less variation than the second reference voltage Vref2.

The high voltage generating circuit 130 generates multiple high voltages to be supplied to the memory core 140. For example, in the depicted embodiment, the high voltage generating circuit 130 includes a high voltage generator 132 that generates a high voltage having a smaller variation range than the supply voltage Vcc, e.g., since the high voltage generated by the high voltage generator 132 is insensitive to a carried operation, such as an erase voltage. The high voltage generating circuit 130 also includes a high voltage generator 131 that generates a high voltage having a smaller variation range with respect to the supply voltage Vcc, e.g., since the high voltage generated by the high voltage generator 131 is sensitive to a carried operation, such as a read or verification voltage.

The flash memory device 200, according to the illustrative embodiment, generates a stable reference voltage having a smaller variation range via the first and second reference voltage generators 110 and 120. Thus, the flash memory device 200 may stably supply multiple constant voltages required to program, erase and read data, respectively.

Figure 7:
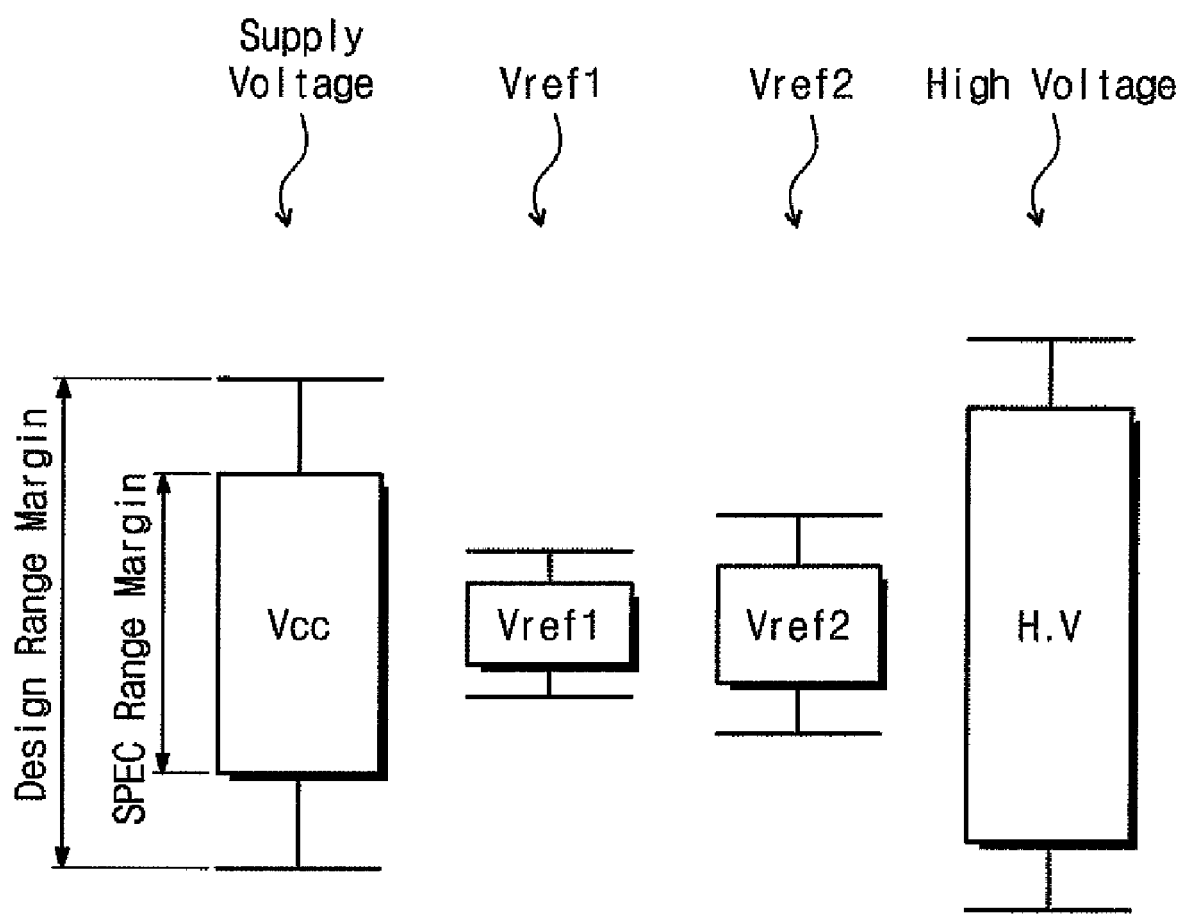
FIG. 7 is a diagram showing voltage variations of a flash memory device, using a first reference voltage generator illustrated in FIG. 1, according to an embodiment of the present invention.
Figure 8:
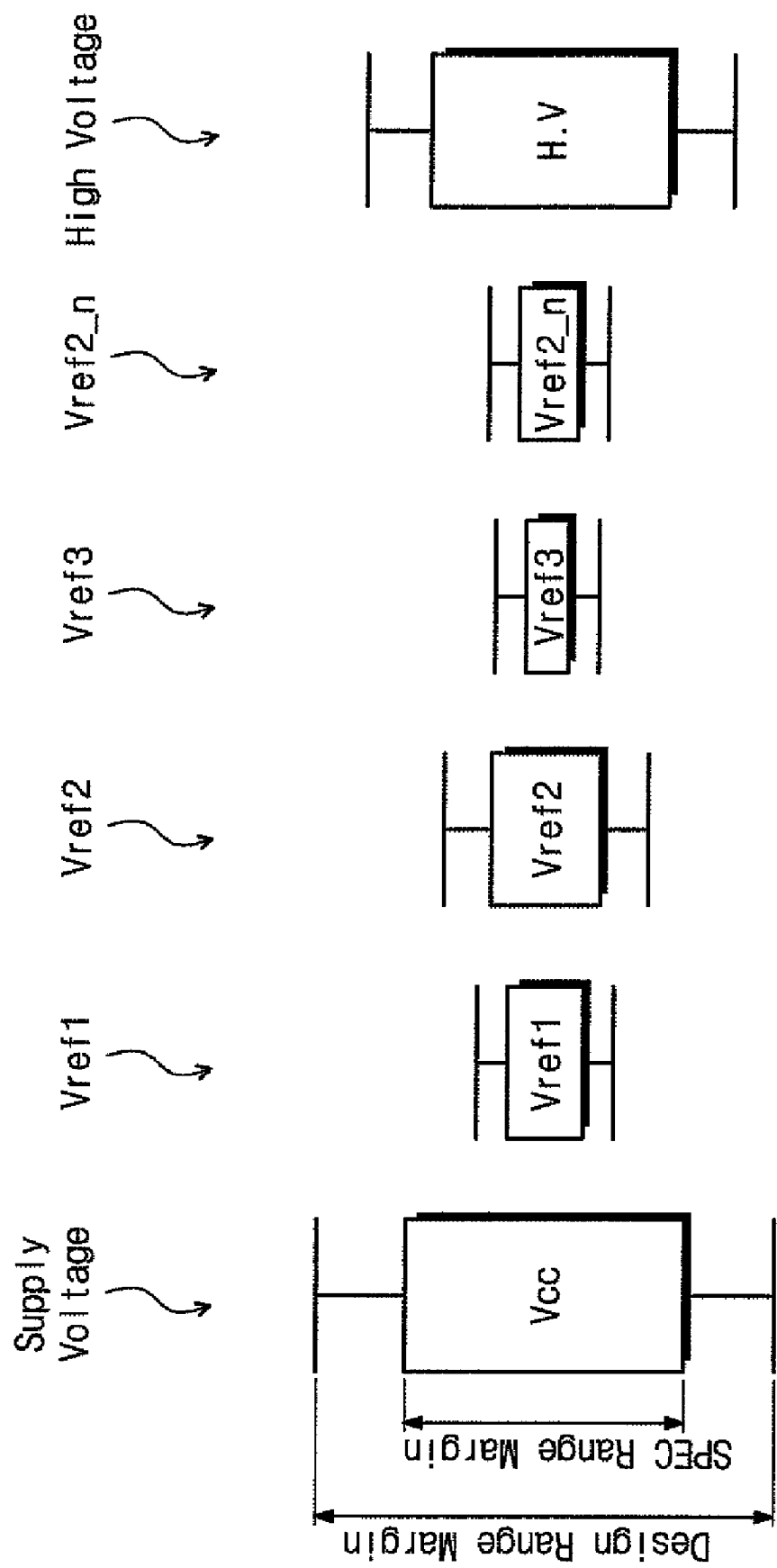
FIG. 8 is a diagram showing voltage variations of a flash memory device, using first and second reference voltage generators illustrated in FIG. 1, according to an embodiment of the present invention.

FIG. 7 is a diagram showing variation ranges of voltages of a flash memory device, according to an illustrative embodiment of the present invention, when using only a first reference voltage generator illustrated in FIG. 1. FIG. 8 is a diagram showing variation ranges of voltages of a flash memory device, according to an illustrative embodiment of the present invention, when using first and second reference voltage generators illustrated in FIG. 1.

Referring to FIGS. 7 and 8, a quadrangle indicates a voltage variation range of a voltage provided by specification, and straight lines on both sides of each quadrangle indicate a voltage variation range provided by design.

The design and specification voltage variation ranges of the supply voltage Vcc shown in FIG. 7 are identical to the design and specification voltage variation ranges of the supply voltage Vcc shown in FIG. 8. Likewise, the voltage variation ranges of first and second reference voltages Vref1 and Vref2 are identical to each other in FIGS. 7 and 8, respectively.

However, FIG. 8 further shows design and specification voltage ranges of the third reference voltage Vref3 and the reference voltage Vref2_n. Referring to FIG. 8, the voltage variation range of the third reference voltage Vref3 is less than the voltage variation range of the first reference voltage Vref1. Also, the voltage variation range of the reference voltage Vref2_n is less than the voltage variation range of the second reference voltage Vref2. Accordingly, the high voltage H.V shown in FIG. 7, generated based on the second reference voltage Vref2, has a greater voltage variation range than the high voltage H.V shown in FIG. 8, generated based on the reference voltage Vref2_n. In other words, the variation range of the high voltage H.V illustrated in FIG. 8 is less than the variation range of the high voltage H.V illustrated in FIG. 7.

The flash memory device according to embodiments of the present invention generates reference voltages having less variation, and generates high voltages to be supplied to the flash memory device using these reference voltages. As a result the high voltages likewise have less variation.

While the present invention has been shown and described in connection with exemplary embodiments thereof, it will be apparent to those skilled in the art that various modifications can be made without departing from the spirit and scope of the invention as defined by the appended claims.

What is claimed is:

1. A flash memory device comprising:
   a memory core;
   a high voltage generating circuit configured to generate a high voltage to be supplied to the memory core; and
   a reference voltage generating circuit configured to generate at least one reference voltage to be supplied to the high voltage generating circuit,
   wherein the reference voltage generating circuit comprises:
      a first reference voltage generator configured to generate a first reference voltage in response to a supply voltage, the first reference voltage generator comprising a first voltage generator, configured to generate a first voltage in response to the supply voltage, and a second voltage generator, configured to receive the first voltage to generate the first reference voltage; and
      a second reference voltage generator configured to generate a second reference voltage in response to the first reference voltage, the at least one reference voltage supplied to the high voltage generating circuit comprising the second reference voltage.

2. The flash memory device of claim 1, wherein the high voltage generating circuit comprises:
   a first high voltage generator which receives the second reference voltage from the second reference voltage generator to generate the high voltage.

3. The flash memory device of claim 2, wherein the high voltage generating circuit further comprises:
   a second high voltage generator which receives the first reference voltage from the first reference voltage generator to generate a second high voltage, a voltage variation range of the second high voltage being greater than a voltage variation range of the first high voltage.

4. The flash memory device of claim 1, wherein a voltage variation range of the second reference voltage is less than a voltage variation range of the first reference voltage.

5. The flash memory device of claim 1, wherein the second reference voltage generator comprises:

a third voltage generator configured to receive the first reference voltage to generate a second voltage; and a fourth voltage generator configured to receive the second voltage to output the second reference voltage.

6. The flash memory device of claim 5, wherein the third voltage generator comprises:
a first node receiving the first reference voltage;
a first resistor connected between the first node and an output terminal;
a first NMOS transistor connected between the output terminal and a second node and having a gate connected to the first node;
a second NMOS transistor connected between the first node and a third node and having a gate connected to the second node; and
a third resistor connected between the second node and the third node, the third node being grounded.

7. The flash memory device of claim 5, wherein the fourth voltage generator comprises a circuit configured the same as the second voltage generator of the first reference voltage generator.

8. The flash memory device of claim 1, wherein the memory core comprises a NOR flash memory.

9. A flash memory device comprising:
a memory core;
a high voltage generating circuit configured to generate a high voltage to be supplied to the memory core; and
a reference voltage generating circuit configured to generate at least one reference voltage to be supplied to the high voltage generating circuit, wherein the reference voltage generating circuit comprises:
a first reference voltage generator configured to generate a first reference voltage in response to a supply voltage; and
a second reference voltage generator configured to generate a second reference voltage in response to the first reference voltage, the at least one reference voltage supplied to the high voltage generating circuit comprising the second reference voltage, and
wherein the high voltage generating circuit comprises:
a charge pump configured to generate a voltage higher than the supply voltage via a charge pump operation;
a high voltage regulator configured to compare an output voltage of the charge pump with one of the first reference voltage or the second reference voltage to generate a control signal; and
a control unit configured to control the charge pump operation of the charge pump in response to the control signal.

10. The flash memory device of claim 9, wherein the high voltage generating circuit further comprises:
a pump oscillator configured to generate a pump clock used to control the charge pump.

11. The flash memory device of claim 9, wherein the first reference voltage generator comprises:
a first voltage generator configured to generate a first voltage in response to the supply voltage; and
a second voltage generator configured to receive the first voltage to generate the first reference voltage.

12. The flash memory device of claim 11, wherein the second reference voltage generator comprises:

a third voltage generator configured to receive the first reference voltage to generate a second voltage; and
a fourth voltage generator configured to receive the second voltage to output the second reference voltage.

13. The flash memory device of claim 12, wherein the third voltage generator comprises:
a first node receiving the first reference voltage;
a first resistor connected between the first node and an output terminal;
a first NMOS transistor connected between the output terminal and a second node and having a gate connected to the first node;
a second NMOS transistor connected between the first node and a third node and having a gate connected to the second node; and
a third resistor connected between the second node and the third node, the third node being grounded.

14. The flash memory device of claim 12, wherein the fourth voltage generator comprises a circuit configured the same as the second voltage generator of the first reference voltage generator.

15. The flash memory device of claim 9, wherein the memory core comprises a NOR flash memory.

16. A reference voltage generating circuit comprising:
a first reference voltage generator configured to generate a first reference voltage in response to a supply voltage; and
a second reference voltage generator configured to generate a second reference voltage in response to the first reference voltage, the second reference voltage being used to generate a high voltage supplied to a memory core,
wherein the first reference voltage generator comprises:
a first voltage generator configured to generate a first voltage in response to the supply voltage; and
a second voltage generator configured to receive the first voltage from the first reference voltage generator to generate the first reference voltage, and
wherein the second reference voltage generator comprises:
a third voltage generator configured to receive the first reference voltage to generate a second voltage; and
a fourth voltage generator configured to receive the second voltage from the third voltage generator to output the second reference voltage.

17. The reference voltage generating circuit of claim 16, wherein the third voltage generator comprises:
a first node receiving the first reference voltage;
a first resistor connected between the first node and an output terminal;
a first NMOS transistor connected between the output terminal and a second node and having a gate connected to the first node;
a second NMOS transistor connected between the first node and a third node and having a gate connected to the second node; and
a third resistor connected between the second node and the third node, the third node being grounded.

18. The reference voltage generating circuit of claim 16, wherein a voltage variation range of the second reference voltage is less than a voltage variation range of the first reference voltage.

* * * * *